United States Patent
Kwon

(10) Patent No.: US 6,631,059 B1
(45) Date of Patent: Oct. 7, 2003

(54) ESD PROTECTION CIRCUIT

(75) Inventor: Kyoung Kuk Kwon, Seoul (KR)

(73) Assignee: Hyundai Electronics Industries Co. Ltd., Kyoungki-Do (KR)

( * ) Notice: Subject to any disclaimer, the term of this patent is extended or adjusted under 35 U.S.C. 154(b) by 255 days.

(21) Appl. No.: 09/640,727

(22) Filed: Aug. 18, 2000

(30) Foreign Application Priority Data

Aug. 21, 1999 (KR) ........................ 1999-34804

(51) Int. Cl.[7] .................. H02H 9/00; H02H 3/22
(52) U.S. Cl. .................. 361/56; 361/56; 361/111
(58) Field of Search ................ 361/56, 111, 119, 361/95, 118, 117

(56) References Cited

U.S. PATENT DOCUMENTS

| | | | | |
|---|---|---|---|---|
| 4,876,620 A | * | 10/1989 | Borkowicz | 361/111 |
| 5,291,051 A | * | 3/1994 | Hoang et al. | 379/73 |
| 5,304,839 A | * | 4/1994 | Chen et al. | 257/355 |
| 5,637,900 A | * | 6/1997 | Ker et al. | 330/252 |
| 5,889,309 A | * | 3/1999 | Yu et al. | 257/355 |
| 5,986,867 A | * | 11/1999 | Duvvury et al. | 257/467 |

\* cited by examiner

*Primary Examiner*—Stephen W. Jackson
*Assistant Examiner*—Danny Nguyen
(74) *Attorney, Agent, or Firm*—Morgan, Lewis & Bockius LLP

(57) ABSTRACT

ESD protection circuit which can effectively protect a product with three or two leveled electrodes in any cases when an external (+) or (−) ESD charge flows into the product, including, in case of the ESD protection circuit for a product with three leveled electrodes(VP, VDD and GND), a first conduction type bipolar transistor and a second conduction type bipolar transistor connected in parallel between an input terminal and a GND, wherein the first conduction type bipolar transistor has a base terminal with a VP voltage applied thereto and the second conduction type bipolar transistor having a base terminal with a VDD voltage applied thereto, and collectors and emitters thereof connected to the input terminal or the GND.

12 Claims, 4 Drawing Sheets

ESD PROTECTION CIRCUIT

BACKGROUND OF THE INVENTION

1. Field of the Invention

The present invention relates to an ESD(Electro Static Discharge) protection circuit, and more particularly, to an ESD protection circuit which can effectively protect a product with three or two leveled electrodes in any cases when an external (+) or (−) ESD charge flows into the product.

2. Background of the Related Art

A related art ESD protection circuit will be explained with reference to the attached drawings. FIG. 1 illustrates a circuit diagram showing a related art ESD protection circuit. Referring to FIG. 1, the related art ESD protection circuit has two MOS transistors TR1 and TR2, wherein the first MOS transistor is a field MOS transistor TR1 and the second MOS transistor is an active MOS transistor TR2. The field MOS transistor TR1 has a gate and a source connected to one pad PAD1 in common, and the active MOS transistor TR2 has a gate connected to the ground GND and a source connected to one pad PAD1. And, drains of the field MOS transistor TR1 and the active MOS transistor TR2 are connected in together. The unexplained 'A' represents a discharge path of a (+) ESD charge flowing into the PAD1, and 'B' is a discharge path of a (−) ESD charge flowing into the PAD1. In a case when a (+) or (−) ESD charge flows from the PAD1 to the PAD2, two transistors identical to the ones connected to the PAD1, i.e., a field MOS transistor TR3 and an active MOS transistor TR4, are provided. In the aforementioned ESD protection circuit, when a (+) ESD charge flows from PAD1 to PAD2, the (+) ESD charge flows to the ground terminal GND via the field MOS transistor TR1 having a gate and a source connected to the PAD1, and is discharged to the PAD2 via the active MOS transistor TR4 having a source connected to the PAD2. And, when a (−) ESD charge flows from PAD1 to PAD2, the (−) ESD charge flows to the ground terminal GND via the active MOS transistor TR2 having a source connected to the PAD1, and is discharged to the PAD2 via the field MOS transistor TR3 having a gate and a source connected to the PAD2. Thus, the related art ESD protection circuit is comparatively strong against (+)(−) ESD charge.

However, the aforementioned related art ESD protection circuit has the following problems.

First, application to a device with three leveled electrodes (−, +and GND), such as CCD(Charge Coupled Device), is not possible, and adjustment of a threshold voltage Vt of the field transistor to a voltage higher than 15 V is difficult for a case the ESD protection circuit should be operative at a voltage higher than 15 V.

Second, since an inversion layer of the MOS(Metal Oxide Semiconductor) is used, the current flows through a surface, rather than bulk.

SUMMARY OF THE INVENTION

Accordingly, the present invention is directed to an ESD protection circuit that substantially obviates one or more of the problems due to limitations and disadvantages of the related art.

An object of the present invention is to provide an ESD protection circuit which can protect a product with three leveled electrodes, such as a CCD, or two leveled electrodes, such as DRAM, in any case when an external (+) or (−) ESD charge flows in.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the ESD protection circuit for a product with three leveled electrodes(VP, VDD and GND) includes a first conduction type bipolar transistor and a second conduction type bipolar transistor connected in parallel between an input terminal and a GND, wherein the first conduction type bipolar transistor has a base terminal with a VP voltage applied thereto and the second conduction type bipolar transistor having a base terminal with a VDD voltage applied thereto, and collectors and emitters thereof connected to the input terminal or the GND.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENT

Figure 1:
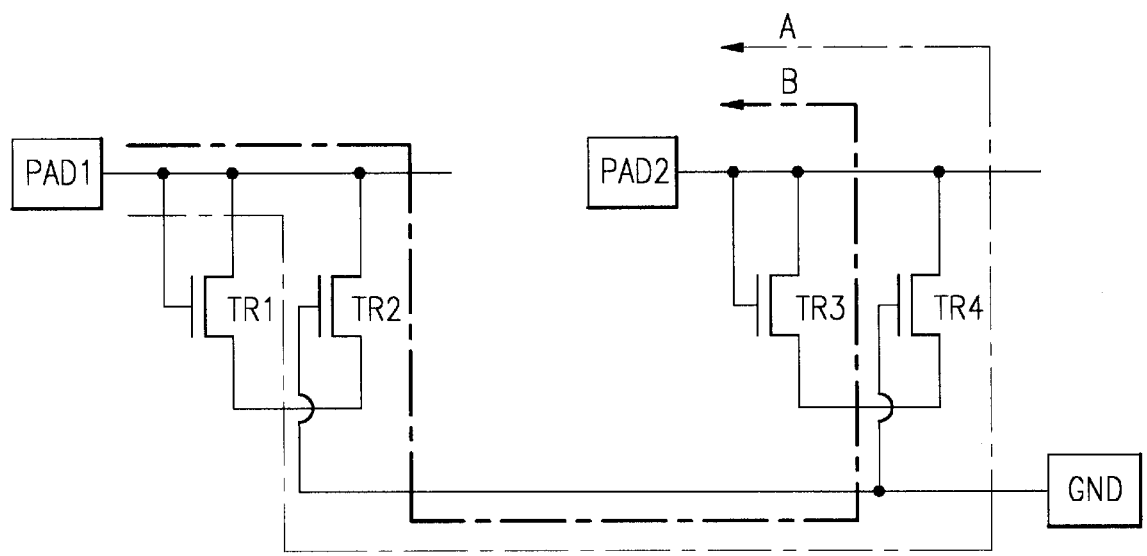
FIG. 1 illustrates a circuit diagram showing a related art ESD protection circuit.
Figure 2:
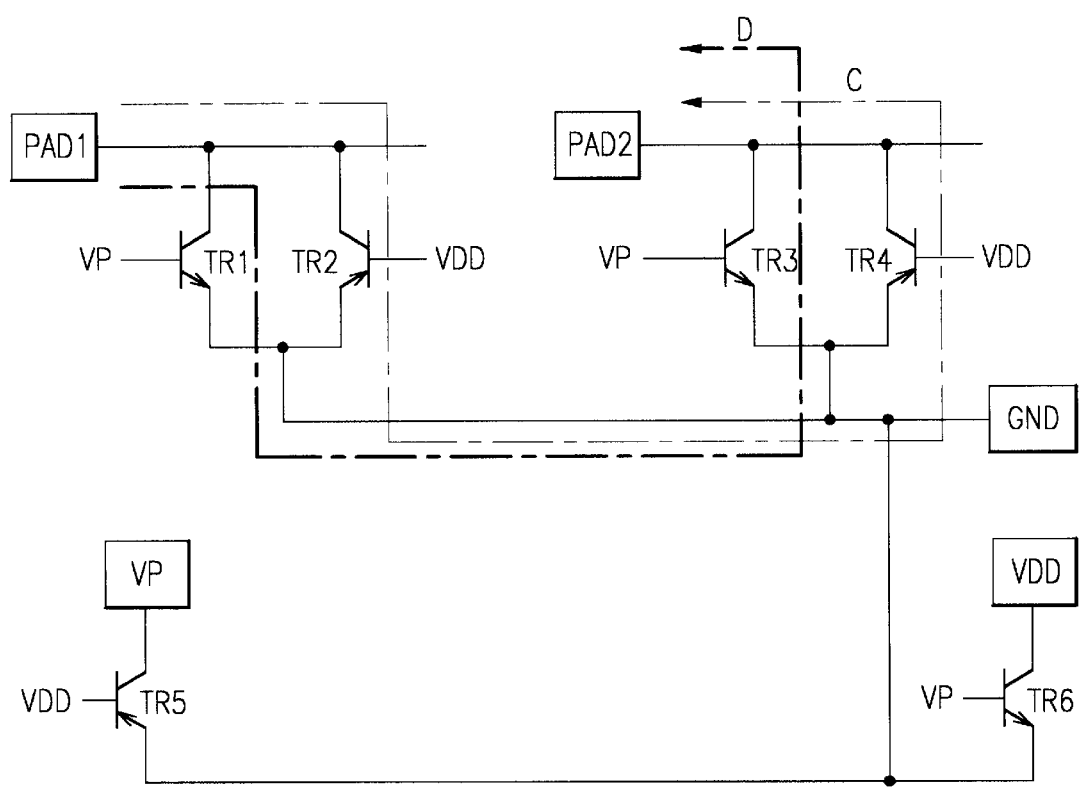
FIG. 2 illustrates a circuit diagram showing an ESD protection circuit in accordance with a preferred embodiment of the present invention.

Reference will now be made in detail to the preferred embodiments of the present invention, examples of which are illustrated in the accompanying drawings. FIG. 2 illustrates a circuit diagram showing an ESD protection circuit in accordance with a preferred embodiment of the present invention.

Referring to FIG. 2, for an ESD protection circuit for a product with three leveled electrodes(VP, VDD, GND), the present invention suggests to provide one pair of an NPN bipolar transistor TR1 and a PNP bipolar transistor TR2 connected in parallel between an input terminal PAD1 and a ground terminal GND. VP is provided to a base of the NPN bipolar transistor TR1 as a lowest negative voltage(VP=−9 V in a case of the CCD), VDD is provided to a base of the PNP bipolar transistor TR2 as a highest positive voltage (VDD=15 V in a case of the CCD), and an emitter and a collector are connected to the PAD1 and the GND, respectively. One pair of an NPN bipolar transistor TR3 and a PNP bipolar transistor TR4 are connected in parallel between an input terminal PAD2 and a ground terminal GND. VP is provided to a base of the NPN bipolar transistor TR3 as a lowest negative voltage(VP=−9 V in a case of the CCD), VDD is provided to a base of the PNP bipolar transistor TR5 as a highest positive voltage(VDD=15 V in a case of the CCD), and an emitter and a collector are connected to the PAD2 and the GND, respectively. And, an emitter or collector is connected between the PAD1, PAD2 and GND, the PNP bipolar transistor TR5 and the NPN bipolar transistor TR6 having VP or VDD applied thereto are provided between respective base4s and emitters or collectors. The bipolar transistors are vertical or horizontal type. And, in an ESD protection circuit for a product with two leveled electrodes(VDD, VSS), an NPN bipolar transistor TR1 and a PNP bipolar transistor TR2 are connected in parallel between a PAD and a ground terminal GND, collectors or emitters of the NPN bipolar transistor TR1 and the PNP bipolar transistor are respectively connected to input terminals or ground terminals, a base terminal of the NPN bipolar transistor TR1 is connected to a ground terminal, and a base of the PNP bipolar transistor TR2 is connected to VDD voltage. The unexplained 'C' denotes a discharge path of the (+) ESD charge flowing to the PAD1, 'D' denotes a discharge path of (−) ESD charge flowing to the PAD1.

Figure 3A:
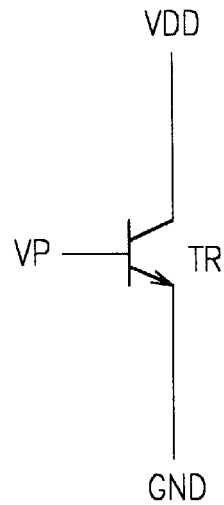
FIGS. 3A and 3B illustrate ESD protection circuits between terminals each having a VP and VDD voltage applied thereto.
Figure 3A:
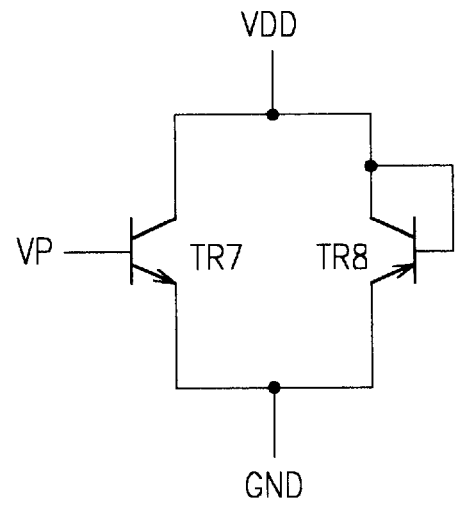
Figure 3B:
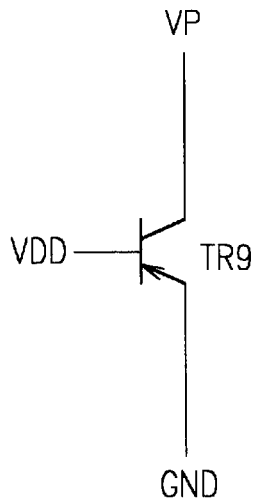
Figure 3B:
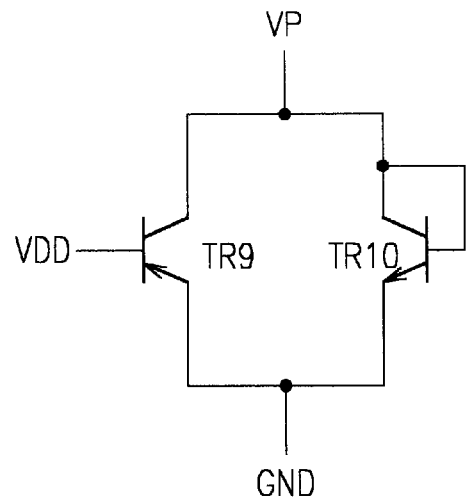

FIGS. 3A and 3B illustrate ESD protection circuits between terminals each having a VP and VDD voltage applied thereto.

Referring to FIG. 3A, the ESD protection circuit having an emitter or collector terminal with a VDD voltage applied thereto may include only one NPN bipolar transistor 7 having a base with a VP applied thereto, or an NPN bipolar transistor TR7 having a base with VP applied thereto and a PNP bipolar transistor TR8 having a collector(or emitter) and a base both with VDD applied thereto. And, the collector or emitter terminal having VDD voltage applied thereto is connected to relevant PAD with a large sized diode, no separate protection circuit is required at times. And, as shown in FIG. 3B, the ESD protection circuit having a collector or emitter terminal with VP voltage applied thereto may includes only one PNP bipolar transistor TR9 having a base with VDD applied thereto, or an NPN bipolar transistor TR10 having a collector and a base both with VDD applied thereto and a PNP bipolar transistor TR9 having a collector (or emitter) and a base connected to VP together. And, the collector or emitter terminal having VP voltage applied thereto is connected to relevant PAD with a large sized diode, no separate protection circuit is required at times.

Figure 4:
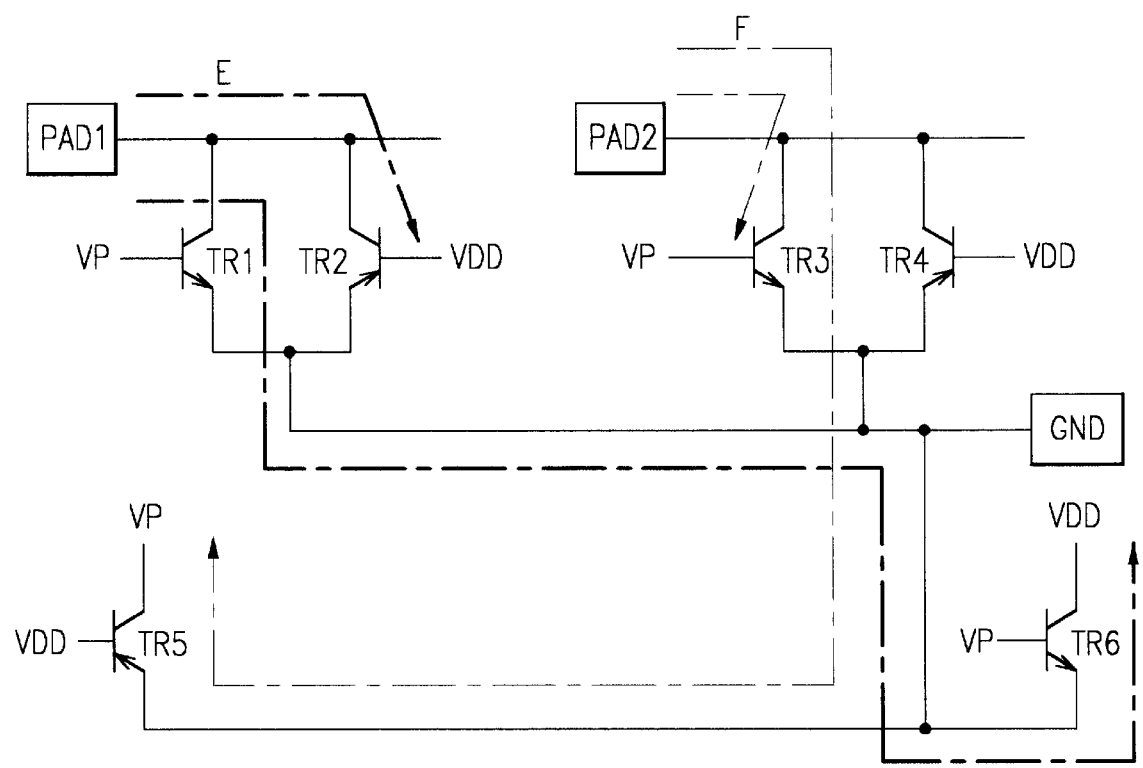
FIG. 4 illustrates a circuit diagram showing a discharge path of a (+)(−) ESD protection circuit in an ESD protection circuit of the present invention; and, FIG. 5 illustrates a circuit diagram showing an ESD protection circuit in accordance with a another preferred embodiment of the present invention.

The operation of the aforementioned ESD protection circuit of the present invention will be explained. FIG. 4 illustrates a circuit diagram showing a discharge path of a (+)(−) ESD protection circuit in an ESD protection circuit of the present invention.

Referring to FIG. 4, when a (+) ESD charge flowed into one PAD1 is discharged through one PAD2, the (+) ESD charge from the PAD1 is discharged to GND via the PNP bipolar transistor TR2 exhibiting forward characteristics to the (+) ESD charge, and is discharged again from the GND via the NPN bipolar transistor TR6 also exhibiting forward characteristics. And, when a (−) ESD charge flowed into one PAD1 is discharged through one PAD2, the (−) ESD to charge from the PAD1 is discharged to GND via the NPN bipolar transistor TR1 exhibiting forward characteristics to the (+) ESD charge, and is discharged again from the GND via the NPN bipolar transistor TR6 also exhibiting forward characteristics. When a (+) or (−) ESD charge flowed into the PAD1 is discharged through VDD terminal, the (+) ESD charge is discharged with easy by a PN diode in the PNP bipolar transistor TR2 of forward characteristics, the (−) ESD charge, as explained before, is discharged to GND via the NPN bipolar transistor TR1, and discharged again to the VDD terminal via the NPN bipolar transistor TR6. And, in a case when the discharge is made from PAD2 to VP, (−) ESD charge is discharged with easy by an NP diode in the NPN bipolar TR3 of forward characteristics, and (+) ESD charge, as explained before, is discharged to GND via the PNP bipolar transistor TR4, and discharged to VP again via the PNP bipolar transistor TR5. The unexplained 'E' denotes a discharge path of (+) ESD charge having forward characteristics, 'F' is a discharge path of (−) ESD charge having forward characteristics.

Figure 5:
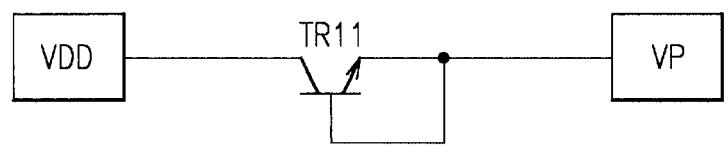

FIG. 5 illustrates a circuit diagram showing an ESD protection circuit in accordance with a another preferred embodiment of the present invention.

Referring to FIG. 5, in order to induce an effective discharge between VDD and VP, a bipolar transistor TR11 is provided between VDD and VP. An emitter or collector of the bipolar transistor TR11 is connected to the VDD, and a base and collector or emitter are connected to VP in common.

As has been explained, the ESD protection circuit of the present invention always facilitates bipolar action for an external ESD charge in a product with three leveled electrodes, such as a CCD, or two leveled electrodes, such as a DRAM by means of forward diodes, thereby improving a discharge efficiency, significantly.

It will be apparent to those skilled in the art that various modifications and variations can be made in the ESD protection circuit of the present invention without departing from the spirit or scope of the invention. Thus, it is intended that the present invention cover the modifications and variations of this invention provided they come within the scope of the appended claims and their equivalents.

What is claimed is:

1. An ESD protection circuit, comprising:
   a first conduction type bipolar transistor and a second conduction type bipolar transistor connected in parallel between an input terminal and a ground terminal, wherein the first conduction type bipolar transistor has a base terminal with a negative power supply voltage applied thereto and the second conduction type bipolar transistor having a base terminal with a positive power supply voltage applied thereto,
   wherein both collectors of the first and-second conduction type bipolar transistors are connected to one of the input terminal and the ground terminal and both emitters of the first and second conduction type bipolar transistors are connected to the other one of the input terminal and ground terminal.

2. A circuit as claimed in claim 1, wherein the first conduction type bipolar transistor is an NPN bipolar transistor, and the second conduction type bipolar transistor is a PNP bipolar transistor.

3. A circuit as claimed in claim 1, wherein the negative power supply voltage is the lowest voltage among negative voltages of the power supply.

4. A circuit as claimed in claim 1, wherein the positive power supply voltage is the highest voltage among positive voltages of the power supply.

5. A circuit as claimed in claim 1, wherein the first conduction type bipolar transistor and the second conduction type bipolar transistor are of a vertical or horizontal form.

6. A circuit as claimed in claim 1, further comprising an ESD protection circuit additionally between bases of the first and second conduction type bipolar transistors and emitters or collectors having VP and VDD applied thereto.

7. A circuit as claimed in claim 6, wherein the additional ESD protection circuit includes a PNP bipolar transistor having one of an emitter and collector with the negative power supply voltage applied thereto and a base with the positive power supply voltage applied thereto.

8. A circuit as claimed in claim 6, wherein the additional ESD protection circuit includes an NPN bipolar transistor having one of an emitter and collector with the positive power supply voltage applied thereto and a base with the negative power supply voltage applied thereto.

9. An ESD protection circuit, comprising:
   a first conduction type bipolar transistor and a second conduction type bipolar transistor connected in parallel between an input terminal and a ground terminal, wherein the first conduction type bipolar transistor has a base terminal with a negative power supply voltage applied thereto and the second conduction type bipolar transistor having a base terminal with a positive power supply voltage applied thereto, and one of collectors and emitters of the first and second bipolar transistors commonly connected to one of the input terminal and the ground terminal.

10. A circuit as claimed in claim 9, wherein the first conduction type bipolar transistor is an NPN bipolar transistor and the second conduction type bipolar transistor is a PNP bipolar transistor.

11. A circuit as claimed in claim 6, wherein the additional ESD protection circuit includes a PNP bipolar transistor having a base with the positive power supply voltage applied thereto and an NPN bipolar transistor having a base and one of a collector and an emitter with the negative power supply voltage applied thereto.

12. A circuit as claimed in claim 6, wherein the additional ESD protection circuit includes an NPN bipolar transistor having a base with the negative power supply voltage applied thereto and a PNP bipolar transistor having a base and one of a collector and an emitter with the positive power supply voltage applied thereto.

* * * * *